(12) United States Patent
Sato et al.

(10) Patent No.: US 6,517,602 B2
(45) Date of Patent: Feb. 11, 2003

(54) SOLDER BALL AND METHOD FOR PRODUCING SAME

(75) Inventors: Koji Sato, Shimane-ken (JP); Takeshi Kuboi, Shimane-ken (JP); Masayoshi Date, Shimane-ken (JP)

(73) Assignee: Hitachi Metals, LTD, Tokyo (JP)

( * ) Notice: Subject to any disclaimer, the term of this patent is extended or adjusted under 35 U.S.C. 154(b) by 0 days.

(21) Appl. No.: 09/805,366

(22) Filed: Mar. 14, 2001

(65) Prior Publication Data

US 2002/0051728 A1 May 2, 2002

(30) Foreign Application Priority Data

Mar. 14, 2000 (JP) ........................................ 2000-070534
Jul. 3, 2000 (JP) ........................................ 2000-200599
Aug. 9, 2000 (JP) ........................................ 2000-241610

(51) Int. Cl.⁷ ................................ B22F 9/08; B22F 1/00
(52) U.S. Cl. ............................. 75/255; 75/340; 75/335; 75/953
(58) Field of Search ........................ 75/255, 340, 953, 75/335

(56) References Cited

U.S. PATENT DOCUMENTS

| | | |
|---|---|---|
| 5,266,098 A | 11/1993 | Chun et al. |
| 5,527,628 A | 6/1996 | Anderson et al. |
| 5,616,164 A * | 4/1997 | Ochiai et al. ................... 75/342 |
| 5,736,074 A * | 4/1998 | Hayes et al. .................... 264/6 |
| 5,891,212 A * | 4/1999 | Tang et al. ..................... 75/335 |
| 6,312,498 B1 * | 11/2001 | Lee et al. ....................... 75/335 |

FOREIGN PATENT DOCUMENTS

| | | |
|---|---|---|
| JP | 05-50286 | 2/1993 |
| JP | 10-211469 | 11/1998 |

* cited by examiner

*Primary Examiner*—Ngoclan Mai
(74) *Attorney, Agent, or Firm*—Sughrue Mion, PLLC

(57) ABSTRACT

A solder ball having a diameter of 1.2 mm or less, a dispersion of a diameter distribution of 5% or less and sphericity of 0.95 or more, an area ratio of the maximum dendrite being 80% or less of a cross section including a center of the solder ball, comprises a first additional element of 0.5–8 mass % of Ag and/or 0.1–3 mass % of Cu, and 0.006–10 mass %, in total, of at least one second additional element selected from the group consisting of Bi, Ge, Ni, P, Mn, Au, Pd, Pt, S, In and Sb, the balance being substantially Sn. The solder ball is produced by a uniform droplet-spraying method comprising the steps of vibrating a melt of a solder alloy in a crucible under pressure to force the melt to drop through orifices of the crucible; permitting the melt dropping through the orifices to become spherical droplets in a non-oxidizing gas atmosphere; and rapidly solidifying them.

18 Claims, 8 Drawing Sheets

Sample No. 5 (Comparative Example)

Sample No. 5 (Comparative Example)

Sample No. 7 (Example)

Sample No. 7 (Example)

200 μm

500 μm

SOLDER BALL AND METHOD FOR PRODUCING SAME

FIELD OF THE INVENTION

The present invention relates to a solder ball for use in bump connection in semiconductor devices, etc., and a method for producing such a solder ball, particularly to a solder ball having high sphericity, smooth surface and high dimension accuracy and a method for producing such a solder ball.

PRIOR ART

Solder balls have conventionally been produced by an in-oil spheroidizing method. The in-oil spheroidizing method of solder balls comprises the steps of (1) introducing fine solder pieces cut at a constant interval into an oil bath having a vertical temperature distribution, (2) heating the fine solder pieces to a temperature higher than their melting point in an upper portion of the oil bath so that they are melted to become spherical by their own surface tension, (3) precipitating the molten spherical solder to a bottom portion of the oil bath kept at a temperature lower than the melting point of the solder, and (4) solidifying them and degreasing and washing them.

Recently proposed as an alternative method to the in-oil spheroidizing method is a production method called "uniform droplet-spraying method." For instance, U.S. Pat. No. 5,266,098 proposes a method for producing uniform metal particles comprising (a) melting a metal in a crucible having orifices, (b) giving pressure and vibration to the resultant metal melt to cause the melt to drop through the orifices in the form of metal melt droplets, (c) applying a positive or negative electric charge to the metal melt droplets before or after passing through the orifices to suppress the coagulation of the metal melt droplets, and (d) cooling them in vacuum or in an inert gas.

With semiconductor devices having increased number of electrodes, their mounting is widely carried out by a bump connection method utilizing fine solder balls, for instance, by BGA (ball grid array). As parts such as chips, resistors, etc., have smaller sizes due to the miniaturization and higher mounting density of equipment, fine solder balls used for their mounting are required to have higher sphericity, higher dimension accuracy, narrower dimension distribution and smoother and cleaner surface. The followings are requirements for the solder balls.

(1) Sphericity

The solder balls are required to have high sphericity. In an apparatus for mounting the solder balls onto BGA packages etc., the solder balls are conveyed by rolling. If the solder balls had poor sphericity, resulting in poor rolling, then they might stop in the apparatus, resulting in poor supply of the solder balls. This necessitates frequent adjustment of the apparatus, leading to lower production efficiency. The solder balls are thus likely required to have sphericity of 0.95 or more.

(2) Dimension Accuracy, Dimension Distribution

The solder balls are required to have high dimension accuracy and narrow dimension distribution. For instance, in the case of BGA by bump connection using fine solder balls, large numbers of fine solder balls are arranged in a lattice manner on the semiconductor device. If there were large distribution in the diameters of the solder balls, there would arise a large gap between the solder balls having small diameters and lands of the substrate at the time of reflow soldering, resulting in insufficient soldering and thus poor connection. To prevent this problem, the diameters of all the solder balls should be measured by a laser measurement apparatus.

Because mechanically cut of cold-worked materials are usually used as solder materials in the in-oil spheroidizing method, it is difficult to make the size of the solder material uniform due to wear of cutting tools.

Therefore, the in-oil spheroidizing method is disadvantageous in failing to providing uniform solder balls. In the case of solder balls of 100–1,000 μm in diameter, they are required to have a dimension accuracy of within ±10 μm, and a dimension distribution within a range of ±5% of the average diameter.

(3) Smooth Surface

The solder balls are required to have smooth surface. For instance, in the case of BGA by bump connection using fine solder balls, a large number of solder balls are arranged at predetermined positions in the lo semiconductor devices at a time, utilizing plurality of nozzles attracting the solder balls by vacuum. In this case, solder balls having ragged surfaces are not attracted by the nozzles, resulting in the production of poor BGA packages in which all solder balls are not necessarily arranged at predetermined positions. Further to obtain good rolling characteristics, they are required to have smooth surface. In the case of the in-oil spheroidizing method, however, smooth surface cannot be maintained if the oil deteriorates, necessitating frequent change of the oil and thus poorer production efficiency.

In the case of the conventional uniform droplet-spraying method, the produced solder balls have different surface raggedness.

(4) Clean Surface

The solder balls are required to have clean surface. If impurities remain on the surfaces of the solder balls, or if carbon-concentrated layers or oxygen-concentrated layers exist on the solder ball surfaces, carbons and oxides remain on the connected surfaces as scum when melting the solder balls for connection, resulting in poor wettability of the solder and thus poorer connection reliability. In the solder ball of the present invention, the thickness of a carbon-concentrated layer is preferably 1 nm or less, and the thickness of the surface oxygen-concentrated layer is preferably 5 nm or less.

Here, the carbon-concentrated layer is a layer in which the concentration of carbon determined by an Auger electron spectroscopy is 15 atomic % or more, and the oxygen-concentrated layer is a layer in which the concentration of oxygen determined by an Auger electron spectroscopy is 15 atomic % or more.

In the oil-spheroidizing method, the resultant solder balls are contaminated with oil, necessitating a degreasing treatment. Further, alkaline degreasing using an alkaline aqueous solution and a solvent degreasing using an organic solvent such as trichloroethylene, trichloroethane, etc., have their own disadvantages. In the case of the alkaline degreasing, alkaline ion in the alkaline aqueous solution is introduced into the semiconductor materials, making it likely to cause erroneous operations of the semiconductor devices. Also the degreasing with an organic solvent is disadvantageous in that there is no organic solvent, which is safe and does not destroy the ozone layer. Trichloroethylene is not safe for human body, and trichloroethane, Flon and Halon are internationally regulated as ozone depletion materials.

Further, with respect to the characteristics of solder balls, degreasing with trichloroethane is disadvantageous in that it provides the solder balls with poor wettability. Also, if the surface of solder balls was contaminated, oxidized layers cannot be removed even with a flux. Further, adjacent balls are coagulated by the oil at the time of mounting the solder balls, failing to achieve good mounting.

OBJECT OF THE INVENTION

Accordingly, an object of the present invention is to provide a solder ball having high sphericity, high dimension accuracy, narrow dimension distribution and smooth and clean surface, and a method for producing such a solder ball.

DISCLOSURE OF THE INVENTION

The solder ball of the present invention produced by a uniform droplet-spraying method has a carbon-concentrated layer of 1 nm or less in thickness and an oxygen-concentrated layer of 5 nm or less in thickness on a surface thereof. The solder ball preferably has an average diameter of 1.2 mm or less, a dispersion of a diameter distribution of 5% or less, more preferably 3% or less, and sphericity of 0.95 or more.

The solder ball of the present invention is characterized in that an area ratio of the maximum dendrite is 80% or less of a cross section including a center of the solder ball. To obtain this metal structure, the solder ball preferably contains one or more additional elements for lowering the melting point of Sn in a total amount of 0.5–60 mass %.

The solder ball preferably contains no Pb. The solder ball of the present invention is preferably made of any one of an Sn—Ag alloy, an Sn—Cu alloy, an Sn—Bi alloy, an Sn—Zn alloy, an Sn—Ag—Cu alloy, an Sn—Ag—Bi alloy, an Sn—Zn—Bi alloy, a Bi—Sn—Ag alloy and an Sn—Ag—Cu—Bi alloy.

The first solder ball of the present invention comprises Ag and/or Cu, the balance being substantially Sn. In the solder ball of this composition, the content of Ag is 0.5–8 mass %, preferably 2–6 mass %, more preferably 1–4.5 mass %. The content of Cu is 0.5–3 mass %, more preferably 1.5–2.5 mass %, more preferably 0.5–1.0 mass %.

The second solder ball of the present invention comprises a first additional element comprising Ag in an amount of 0.5–8 mass %, preferably 1–6 mass %, more preferably 1–4.5 mass %, and/or Cu in an amount of 0.1–3 mass %, 0.2–2 mass %, more preferably 0.3–1.2 mass %, and at least one second additional element selected from the group consisting of Bi, Ge, Ni, P, Mn, Au, Pd, Pt, S, In and Sb, the balance being substantially Sn.

The content of the second additional element in the second solder ball may differ depending on the melting point and hardness thereof. In the case of a high-melting-point, low-hardness solder ball, a solder ball comprising only Ag or Cu contains the second additional element in a total amount of 0.01–0.5 mass %, preferably 0.01–0.2 mass %, while a solder ball comprising both Ag and Cu contains the second additional element in a total amount of 0.006–0.5 mass %, preferably 0.006–0.1 mass %. In the case of a low-melting-point, high-hardness solder ball, the second additional element is 1–60 mass %, preferably 2–20 mass %, more preferably 3–10 mass % in total.

The method for producing a solder ball according to the present invention comprises the steps of vibrating a melt of a solder alloy in a crucible under pressure to force the melt to drop through orifices of the crucible, permitting the melt dropping through the orifices to become spherical droplets in a non-oxidizing gas atmosphere, and rapidly solidifying them.

The non-oxidizing gas atmosphere is preferably a reducing atmosphere. The reducing atmosphere is preferably an inert gas atmosphere comprising 5–10 volume % of hydrogen.

BRIEF DESCRIPTION OF THE DRAWINGS

FIG. 3($b$) is a graph showing a sphericity distribution of the Sn—Pb eutectic solder ball in EXAMPLE 1;

FIG. 4($b$) is a graph showing a diameter distribution of the Sn—Bi solder ball in COMPARATIVE EXAMPLE 4;

DESCRIPTION OF THE PREFERRED EMBODIMENT

Figure 1:
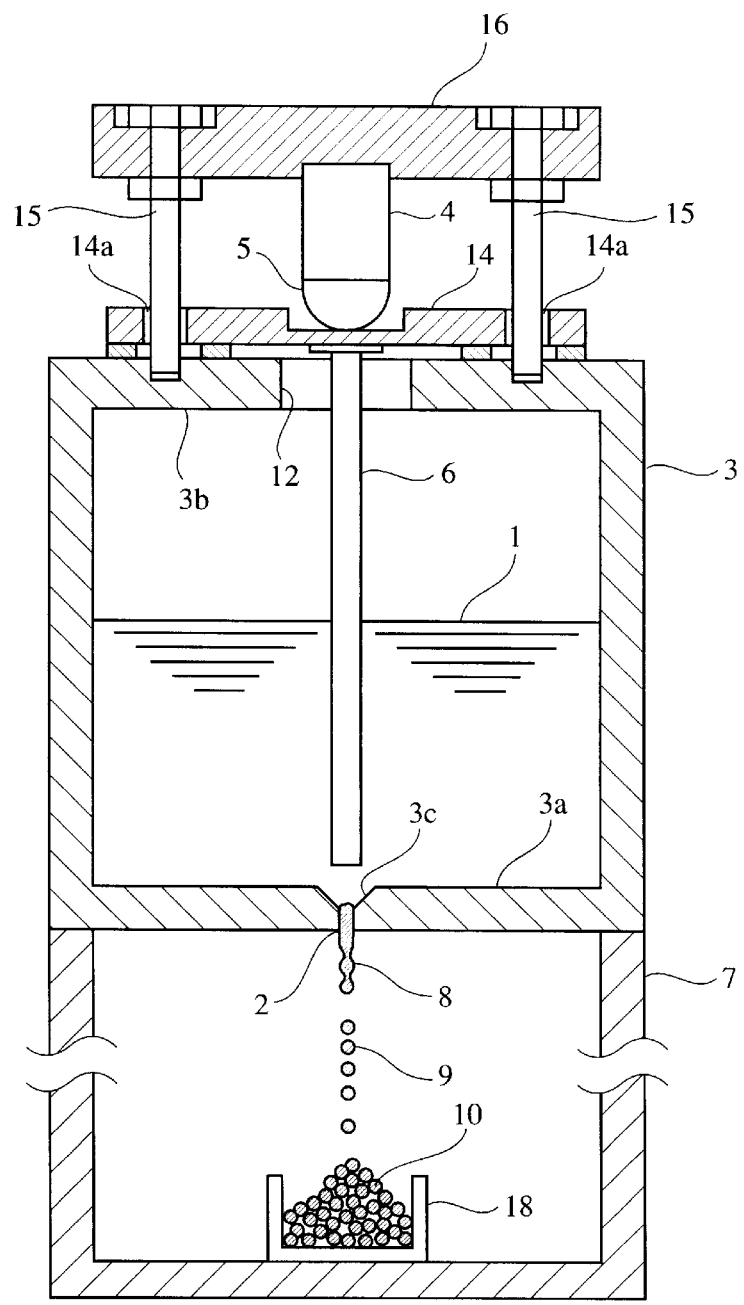
FIG. 1 is a cross-sectional view showing one example of an apparatus for producing the solder ball of the present invention.

The solder ball of the present invention and its production apparatus and method will be described below referring to the attached drawings, without intention of restricting the present invention thereto.

[1] Solderballs (A) Composition

The solder alloys, to which the present invention is applicable, include those containing Pb and those not containing Pb, and solder alloys containing no Pb are more advantageous than those containing Pb because of smaller influence on environment.

(1) Solder Alloys Containing Pb

Solder alloys containing Pb include Pb—Sn alloys such as 37Pb-63Sn, 40Pb-60Sn, 50Pb-50Sn, 44Pb-56Sn, etc., Pb—In alloys and Sn—Pb—Bi alloys such as Sn-32Pb-52Bi, 19Sn-31Pb-50Bi, 34Sn-20Pb-46Bi, 43Sn-43Pb-14Bi, etc., Sn—Pb—Sb alloys such as 35Sn-64.5Pb-0.5Sb, 32Sn-66Pb-2Sb etc., Sn—Bi—In alloys such as 17Sn-57Bi-26In etc., and Pb—Ag alloys such as 97.5Pb-2.5Ag etc.

(2) Solder Alloys Containing No Pb

Solder alloys containing no Pb generally include alloys substantially composed of 100% Sn, Sn—Ag alloys such as Sn-2Ag, Sn-3.5Ag, Sn-4Ag, Sn-5Ag, Sn-3.5Ag-1Zn, etc., Sn—In alloys such as Sn-35In, Sn-51In, Sn-52In, etc., Sn—Zn alloys such as Sn-9Zn, Sn-70Zn, etc., Sn—Cu alloys such as Sn-0.7Cu, etc., Sn—Bi alloys such as Sn-5Bi, Sn-57Bi, Sn-58Bi, Sn-5Bi-1Cu, Sn-5Bi-0.05Ge, etc., Sn—Bi—In alloys such as Sn-5Bi-2In, Sn-57Bi-26In, Sn-5Bi-2In-1Cu, Sn-5Bi-2In-1Ni, etc., Sn—Sb alloys such as Sn-5Sb, Sn-5Sb-1Cu, Sn-5Sb-1Zn, Sn-5Sb-2In, etc., Sn—Sb—Ag alloys such as Sn-5Sb-2Ag-2In, Sn-5Sb-2Ag-1Cu, Sn-5Sb-2Ag-1Ni, etc., Sn—Cd—Ag alloys such as Sn-85Cd-5Ag, etc., Sn—Ag—In alloys such as Sn-3.5Ag-1In, Sn-3.5Ag-2In, Sn-5Bi-1Ag-2In, Sn-3.5Ag-2In-1Cu, Sn-3.5Ag-2In-1Ni, etc., Sn—Ag—Cu alloys such as Sn-1.0Ag-0.5Cu, Sn-3.0Ag-0.5Cu, Sn-2.0Ag-0.5Cu, Sn-3.5Ag-0.75Cu, Sn-0.5Ag-4Cu, etc., Sn—Ag—Cu—Bi alloys such as Sn-2.5Ag-0.5Cu-1Bi, etc., Sn—Zn alloys such as Sn-9Zn, etc., Sn—Zn—In alloys such as Sn-9Zn-5In, etc., Sn—Zn—Bi alloys such as Sn-8Zn-3Bi, Sn-9Zn-10In etc., Sn—Ag—Bi alloys such as Sn-2Ag-5Bi, Sn-2Ag-7.5Bi, In—Ag alloys such as In-3Ag etc., and Au—Sn alloys such as Au-20Sn, etc.

As a result of intensive research to obtain a solder alloy composition with which one most grown dendrite occupies 80% or less of an area in a cross section including a center of the solder ball, it has been found that in the case of an Sn solder alloy, an Sn alloy having a melting point equal to or higher than the melting point (232° C.) of pure Sn contains a small number of dendrites grown at the time of solidification of the solder balls, resulting in the maximum dendrite having an area ratio of more than 80%, thereby providing the solder balls with ragged surfaces. A
s a result of investigation on influence of elements (additional elements) serving to decrease the melting point of Sn to lower than 232° C. on the surface conditions of the resultant solder balls, it has been found that when 0.5–60 mass %, in total, of an additional element for lowering the melting point of Sn is added, the resultant solder ball has a metal structure in which the maximum dendrite occupies 80% or less of an area in a cross section including a center of the solder ball, resulting in the solder ball having a smooth surface. When the additional element exceeds 60 mass %, the resultant solder ball fails to have preferable properties as a solder such as mechanical strength, soldering temperature, etc. The additional elements for lowering the melting point of Sn are preferably contained in a total amount of 2 mass % or more. This decreases the dependency of the properties on cooling conditions in the production process, resulting in remarkable improvement in surface conditions.

The first Sn solder ball of the present invention contains a first additional element of Ag and/or Cu. Sn—Ag, Sn—Cu and Sn—Ag—Cu solders are high-melting-point, low-hardness solders. In the first Sn solder ball, the content of Ag is 0.5–8 mass %, preferably 2–6 mass %. The content of Cu is 0.5–3 mass %, preferably 1.5–2.5 mass %. Ag and Cu may be added in combination.

The second Sn solder ball of the present invention preferably contains at least one second additional element selected from the group consisting of Bi, Ge, Ni, P, Mn, Au, Pd, Pt, S, In and Sb, in addition to the first additional element. In the second Sn solder ball, the content of Ag is 0.5–8 mass %, preferably 1–6 mass %, more preferably 1–4.5 mass %. The content of Cu is 0.1–3 mass %, preferably 0.2–2 mass %, more preferably 0.3–1.2 mass %. Ag and Cu may be added in combination.

The content of the second additional element in the second solder ball may change depending on the melting point and hardness of the solder ball. In the case of a high-melting-point, low-hardness solder, the composition of a solder ball containing Ag or Cu without combination is such that the second additional element is 0.01–0.5 mass %, preferably 0.01–0.2 mass % in total, and the composition of a solder ball containing both Ag and Cu is such that the second additional element is 0.006–0.5 mass %, preferably 0.006–0.1 mass % in total. In the case of a low-melting point, high-hardness solder, the second additional element is 1–60 mass %, preferably 2–20 mass %, more preferably 3–10 mass % in total.

Figure 10:
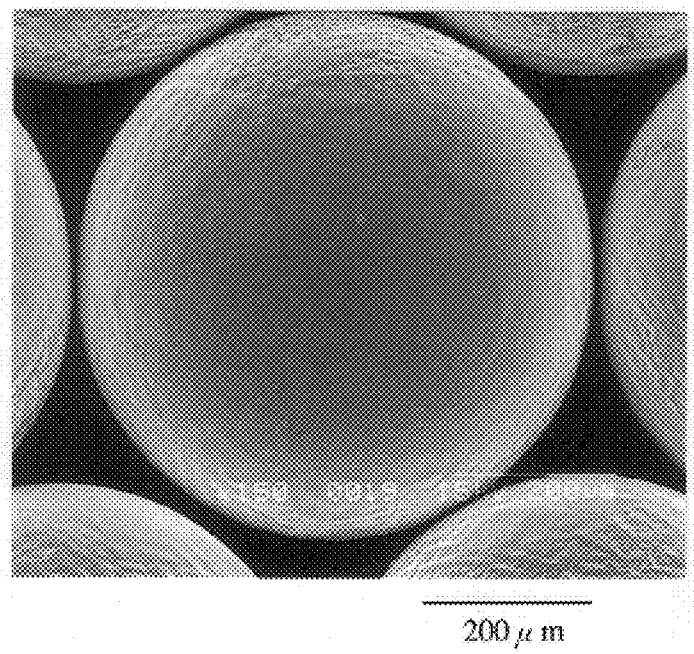
FIG. 10 is a scanning-type electron photomicrograph showing a surface condition of the solder ball of the present invention.
Figure 11:
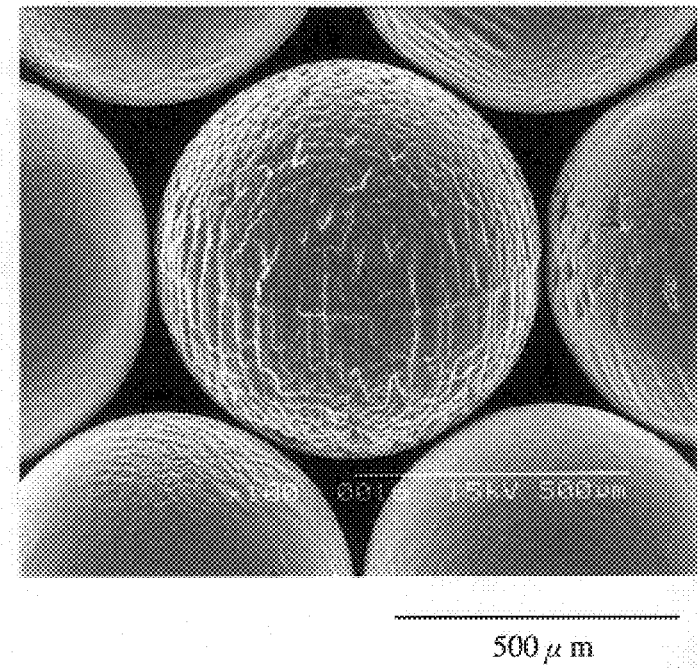
FIG. 11 is a scanning-type electron photomicrograph showing a surface condition of the solder ball having surface raggedness.

Taking Sn-3.5Ag alloy (mass %) for instance, explanation will be made on why the content of the second additional element should be 0.01 mass % or more in total to obtain a solder ball having a smooth surface. Solder balls made of an Sn-3.5Ag (mass %) alloy containing 0.01 mass % or more of other element (additional element) than Sn and Ag have smooth surfaces as shown in FIG. 10, while solder balls made of an Sn-3.5Ag alloy containing less than 0.01 mass % of the second additional element have extremely ragged surfaces as shown in FIG. 11. Thus, it is found that when the Sn-3.5Ag alloy contains 0.01 mass % or more of the second additional element, the resultant solder balls have smooth surfaces. The effects of adding the second additional element can also be appreciated in solder alloys having other compositions (Sn—Ag alloys, Sn—Cu alloys and Sn—Ag—Cu alloys).

Though the mechanism of providing smooth surfaces to solder balls by the second additional element is not necessarily clear, it may be presumed as follows: Observed in the solidification structure of a solder ball having a smooth surface is a eutectic structure comprising a lot of primary dendrites of β-Sn and an intermetallic compound phase of β-Sn and Sn—Ag or Sn—Cu between the dendrite. On the other hand, the solder ball having a ragged surface has a solidification structure without clear crystal grain boundaries, verifying that the number of primary dendrites is reduced. It is considered from this difference in a metal structure that the growing size of primary dendrites of β-Sn are smaller in the solder ball containing 0.01 mass % or more of the second additional element than in the solder ball containing less than 0.01 mass % of the additional element. Why the growing size of primary dendrites is small is considered that a large amount of the second additional element contained expands a solid-liquid coexisting region and lowers the melting point of the alloy. During a slow solidification, a large number of nuclei can be formed, resulting in a solder ball having a large number of crystals. As a result, the solder ball has a smooth surface.

It is considered that when the solder ball is solidified relatively slowly, there is enough time for making the surface of the solder ball smooth by a surface tension, even though raggedness appears on a surface of a spherical melt droplet due to volume shrinkage by partial solidification of the spherical droplet. Further, because the surface of the solder ball functions as a site of ununiformly generating nuclei, the solder ball becomes a polycrystalline body, thus having a smooth surface. On the other hand, when the solder ball is solidified rapidly, raggedness appearing on the melt droplet surface by volume shrinkage during the solidification is not eliminated by a surface tension, resulting in a solder ball having a ragged surface.

In the second additional elements, the content of Bi is preferably 0.001–10 mass %, more preferably 0.001–4 mass %, most preferably 0.001–0.2 mass %. When the content of Bi is adjusted within a range of 0.001–10 mass %, the solder alloy has a lowered welding temperature, giving an improved soldering strength.

Ge has a function to improve oxidation resistance. When 0.005 mass % or more of Ge is contained, the solder ball has an extremely improved oxidation resistance. The upper limit of the amount of Ge added is preferably 0.1 mass % to avoid the deterioration of properties of the solder.

Ni, P, Mn, Au, Pd, Pt, S, In and Sb have a function to improve a welding strength of the solder ball. Sb also has a function to smooth the surface of the solder ball. When the content of Sb increases, the melting point of the solder alloy exceeds the melting point of Sn. Accordingly, Sn is preferably added together with other additional elements such as Ag.

Another element contained in the solder alloy in addition to the above additional elements may be N. N is introduced into a solder ball in a molten or solidifying state from an ambient nitrogen gas atmosphere. Increase in the content of N accelerates the formation of nuclei, resulting in increase in the number of dendrites. However, the inclusion of too much N results in the deterioration of soldering characteristics. Accordingly, N may be contained in a range not to deteriorate the properties of the solder.

The specific compositions of the second solder ball of the present invention may be as follows:
(1) A composition comprising 1–4.5 mass % of Ag, and 0.01–0.2 mass % of the second additional element, the balance being substantially Sn.
(2) A composition comprising 0.3–1.2 mass % of Cu, and 0.01–0.2 mass % of the second additional element, the balance being substantially Sn.
(3) A composition comprising 1–4.5 mass % of Ag, 0.3–1.2 mass % of Cu, and 0.006–0.1 mass % of the second additional element, the balance being substantially Sn.
(4) A composition comprising 1–4.5 mass % of Ag, 0.1 mass % or less of Ge, and 0.01–0.2 mass % of the second additional element (except for Ge), the balance being substantially Sn.
(5) A composition comprising 0.3–1.2 mass % of Cu, 0.1 mass % or less of Ge, and 0.01–0.2 mass % of the second additional element (except for Ge), the balance being substantially Sn.
(6) A composition comprising 1–4.5 mass % of Ag, 0.3–1.2 mass % of Cu, 0.1 mass % or less of Ge, and 0.006–0.1 mass % of the second additional element (except for Ge), the balance being substantially Sn.
(7) A composition comprising 0.3–1 mass % of Cu, and 0.2–0.8 mass % of Bi, the balance being substantially Sn.
(8) A composition comprising 7–10 mass % of Zn, and 2–4 mass % of Bi, the balance being substantially Sn.
(9) A composition comprising 1.5–3.5 mass % of Ag, 0.3–0.9 mass % of Cu, and 0.5–1.5 mass % of Bi, the balance being substantially Sn.
(10) A composition comprising 0.3–1 mass % of Cu, 0.2–0.8 mass % of Bi, and 0.006–0.1 mass % of the second additional element (except for Bi), the balance being substantially Sn.
(11) A composition comprising 7–10 mass % of Zn, 2–4 mass % of Bi, and 0.006–0.1 mass % of the second additional element (except for Bi), the balance being substantially Sn.
(12) A composition comprising 1.5–3.5 mass % of Ag, 0.3–0.9 mass % of Cu, 0.5–1.5 mass % of Bi, and 0.006–0.1 mass % of the second additional element (except for Bi), the balance being substantially Sn.

The melting points and hardness of various Sn solder alloys are shown in Table 1 below.

TABLE 1

| Type | Composition | Melting Point (° C.) | Hardness (Hv) |
|---|---|---|---|
| High-Melting-Point, Low-Hardness Solder | Sn—Cu—Bi | 225~230 | 12~18 |
| | Sn—Ag—Cu | 215~225 | 12~17 |
| | Sn—Ag—Cu—Bi | 205~225 | 17~28 |
| Low-Melting-Point, High-Hardness Solder | Sn—Zn(—Bi) | 175~200 | 23~33 |
| | Sn—Bi(—Ag) | 135~140 | 38~42 |

The solder ball containing the second additional elements has a solidification structure equal or similar to a eutectic structure, or a structure having a plurality of colonies, an area ratio of the maximum dendrite being 80% or less in a cross section including a center of the solder ball.

(B) Structure

The solidification structure of the solder ball of the present invention obtained by the uniform droplet-spraying method directly affects the surface conditions of the solder ball. As a result of detailed investigation on the relations between the cross section structure spherically solidified solder ball of 1 mm or less in diameter and its surface conditions, it has been found that portions near tip ends of dendrites, which are considered finally solidified in the solder ball appearing on a surface, are more ragged than the other portions. On the contrary, surface portions from which dendrites are first formed are sufficiently smooth. Solder balls having solidification structures consisting only of colonies without dendrites also have smooth surfaces.

Further detailed observation has reviewed that (1) when a solder ball is constituted by only one crystal, the surface portion near a tip end of dendrite, which is considered finally solidified portion appearing on a surface, has more ragged surface than the other portion; (2) when a solder ball is constituted by two or more crystals, surface portions from which solidification starts are smooth; (3) when the solder ball has a solidification structure in which different dendrites have tip ends in contact with each other, the solder ball has a smooth surface; and thus (4) in a solder ball mostly occupied by a single crystal particle, one dendrite grows extremely large, providing a narrow smooth surface portion (solidification initiation portion) and a wide ragged surface portion (solidification termination portion).

Figure 5:
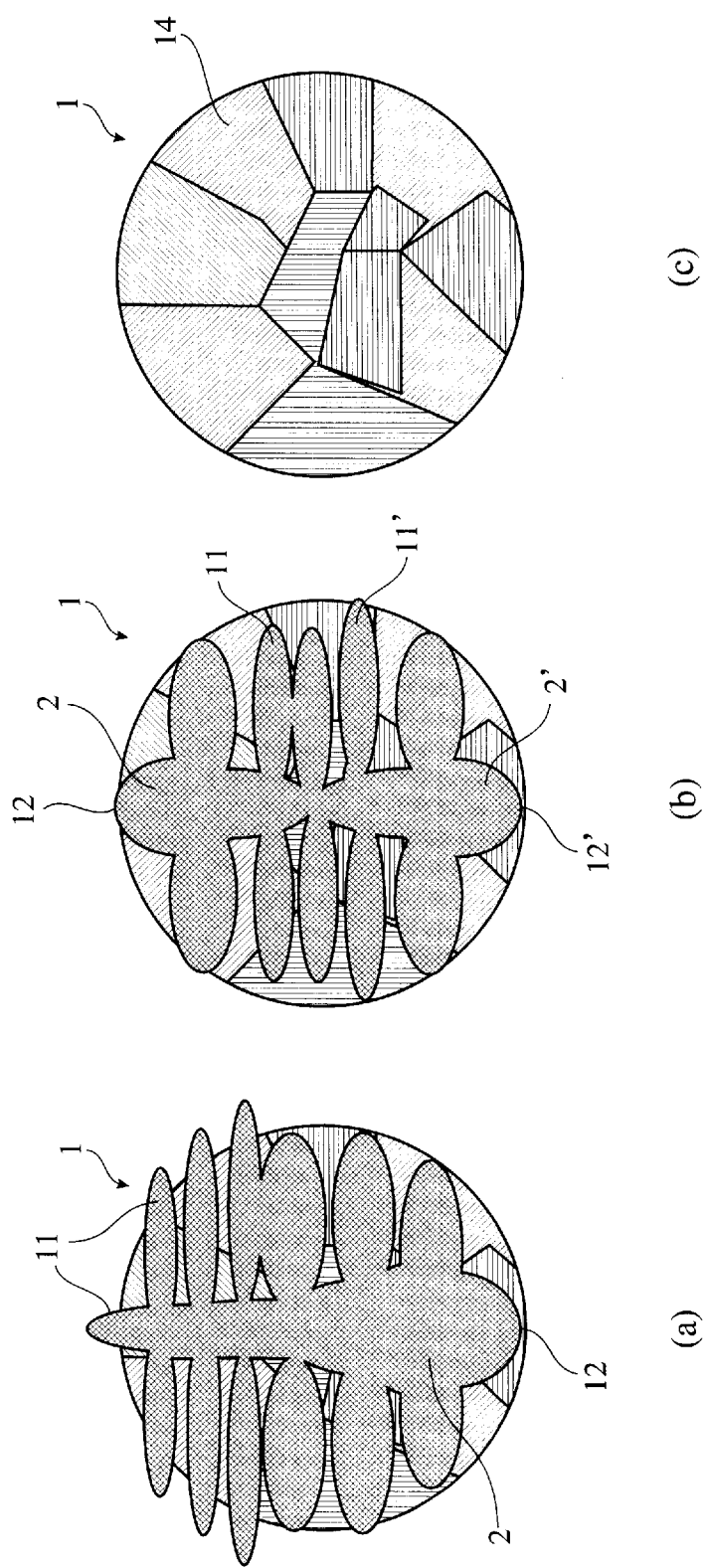
FIG. 5 is a schematic view showing the relation between the cross section structure and surface raggedness of the solder ball.

The relation of the solidification structure of the solder ball and its surface conditions will be explained referring to the schematic view shown in FIG. 5. As shown in FIG. 5(a), the solder ball 1 having a solidification structure, in which one dendrite 2 grows large, has a ragged surface in a final solidification portion 11 in an upper portion in the figure, and a smooth surface portion corresponding to the solidification initiation portion 12 in a lower portion in the figure. In this case, one most grown dendrite 2 has an area ratio exceeding 80%, with a tip end of dendrite 2 projecting from the surface of the sphere, resulting in a ragged surface. Also, it has a small smooth surface in the solidification initiation portion 12. Accordingly, the resultant solder ball has a more ragged surface.

In the solidification structure in which two dendrites 2, 2' of substantially the same size grow from the upper and lower portions in the figure as shown in FIG. 5(b), however, ragged surface portions are considered narrow in the final solidification portions 11, 11'. Also, the solder ball has a wide smooth surface in the solidification initiation portions 12, 12'.

Accordingly, the resultant ball 1 has a relatively smooth surface with less raggedness. In this case, the area ratio of the most grown dendrites 2, 2' is 80% or less, with tip ends of dendrites 2, 2' suppressed from projecting from the surface.

As show in FIG. 5(c), a smooth surface is obtained in the solder ball 1 having a solidification structure that is completely eutectic consisting only of colonies 14 without dendrites. Observing the solidification structure in a cross section including a center of the sphere, it has been found that if the area ratio of the most grown dendrite is 80% or less, the solder ball has a smooth surface without raggedness. Accordingly, an important feature of the present invention is that the area ratio of the maximum dendrite in a cross section including a center of the solder ball is 80% or less. The preferred area ratio of the maximum dendrite is 60% or less.

The solder ball of the present invention produced by the uniform droplet-spraying method is characterized in that the thickness of the carbon-concentrated layer is 1 nm or less, and that the thickness of an oxygen-concentrated layer is 5 nm or less on the surface. As described above, the carbon-concentrated layer is a layer in which the concentration of carbon is 15 atomic % or more when measured by Auger electron spectroscopy, and the oxygen-concentrated layer is a layer in which the concentration of oxygen is 15 atomic % or more when measured by Auger electron spectroscopy. The preferred thickness of the carbon-concentrated layer is 1 nm or less, and the preferred thickness of the oxygen-concentrated layer is 5 nm or less.

(C) Shape

The solder ball of the present invention produced by the uniform droplet-spraying method preferably has an average diameter of 1.2 mm or less, a dispersion of its diameter distribution being 5% or less, particularly 3% or less, and its sphericity being 0.95 or more.

[2] Production Apparatus

When solder balls have diameters exceeding 1.2 mm, a dispersion of a diameter distribution exceeding 5% and sphericity of less than 0.95, they can be produced by a conventional in-oil spheroidizing method, though those produced by the in-oil spheroidizing method have as thick carbon-concentrated layers as more than 1 nm and as thick oxygen-concentrated layers as more than 5 nm. Such solder balls fail to meet the requirements necessary for industrial applications. Accordingly, the present invention utilizes a uniform droplet-spraying method to produce solder balls having small diameter distribution, high sphericity and excellent surface conditions.

The solder ball of the present invention can be produced by a uniform droplet-spraying apparatus, for instance, as shown in FIG. 1. This production apparatus comprises a crucible 3 for a melt 1 having orifices 2 at the bottom wall 3a and an opening 12 on the upper wall 3b, a chamber 7 attached to the bottom of the crucible 3, a vibration plate 14 fixed to the upper wall 3b of the crucible 3, a vibration rod 6 fixed to a lower surface of the vibration plate 14 and extending in the crucible 3 near the orifices 2, a movable plate 16 having a pair of legs 15, 15 vertically movably supported by the openings 14a, 14a of the vibration plate 14, a vibrator 4 fixed to a lower surface of the movable plate 16, a vibration transmission member 5 fixed to a tip end of the vibrator 4 and in contact with an upper surface of the vibration plate 14, and a container 18 disposed in the chamber 7 for recovering solder balls.

(1) Crucible

The crucible 3 may be a known-crucible used for melting solder alloys. The bottom portion 3a of the crucible around each orifice 2 preferably has a taper or step 3c to keep the flow of the melt 1 near the orifice 2 substantially laminar.

To prevent the oxidation of the melt 1, an atmosphere in the crucible 3 is an inert gas or a mixture gas of an inert gas and a hydrogen gas, etc. A ratio of the hydrogen gas mixed is preferably 5–10 volume %, for instance, about 8 volume %. Because moisture and oxygen, impurities in the inert gas, are strongly oxidative to the melt 1, their amounts should be minimized. Because a hydrogen gas is reductive, it is effective to prevent the oxidation of the melt.

To extrude the melt 1 by vibration from the crucible 3 to the chamber 7, the pressure in the crucible 3 is preferably higher than that in the chamber 7 by 0.3 MPa or less, particularly 0.01–0.3 MPa. To obtain this difference in pressure, a gas control apparatus may be used.

(2) Vibrator

The vibrator 4 for vibrating the vibration rod 6 may be a piezoelectric vibrator, a magnetostriction vibrator, an electromagnetic solenoid, etc. Particularly the piezoelectric vibrator is preferable because it has a high resonance frequency. A laminate-type piezoelectric vibrator, that is small and provides large vibration, is also preferable. Because the piezoelectric vibrator looses piezoelectric characteristics at a high temperature of about 370 K, heat dissipated from the crucible 3, etc., should be reduced. For that purpose, the vibrator 4 may be cooled or the vibrator 4 may be placed distant from a heat source.

(3) Vibration Rod

The vibration rod is preferably a rod of a simple shape without a vibration disc as shown in FIG. 1. If it has a vibration disc, a high vibration number of the piezoelectric vibrator is not accurately conveyed to the orifices 2. The vibration rod 6 may be made of a material that does not react with the melt 1, usually stainless steal. When the vibration rod 6 is made of a low-density ceramic such as silicon nitride, aluminum nitride, etc., the rod has a high resonance point, capable of transmitting high-frequency vibration of the vibrator 4 efficiently, and the rod has a small inertia moment, resulting in easy vibration at a large amplitude.

(4) Chamber

The chamber 7 is usually filled with a cooled non-oxidizing gas atmosphere to rapidly solidify the melt droplets 9 ejected through the orifices 2 while preventing their oxidation. The non-oxidizing atmosphere may be an inert gas atmosphere such as nitrogen, argon, carbon dioxide gas, etc., or an atmosphere of such an inert gas mixed with hydrogen gas or CO gas, etc. The percentage of a hydrogen gas mixed is preferably 5–10 volume %, more preferably, for instance, about 8 volume %. The content of moisture and oxygen, impurities in the inert gas, should be as small as possible because they oxidize the surface of the melt droplets 9 while being solidified. Because the hydrogen gas is reductive, it is effective to prevent the oxidation of the melt droplets 9.

The atmosphere in the chamber 7 is preferably pressurized at a gage pressure of 0.01–0.3 MPa. When the gage pressure is lower than 0.01 MPa, the atmosphere in the chamber 7 cannot fully be maintained. On the other hand, when it exceeds 0.3 MPa, the chamber 7, a pressure container, is expensive for safety design. The gage pressure of the chamber 7 is more preferably 0.02–0.15 MPa, further preferably 0.05–0.12 MPa. With the chamber 7 pressurized, the melt droplets 9 can surely move substantially in a laminar flow in the gas-tight chamber 7, and the solidification speed of the melt droplets 9 is increased, making it possible to reduce the height of the chamber 7.

Figure 2:
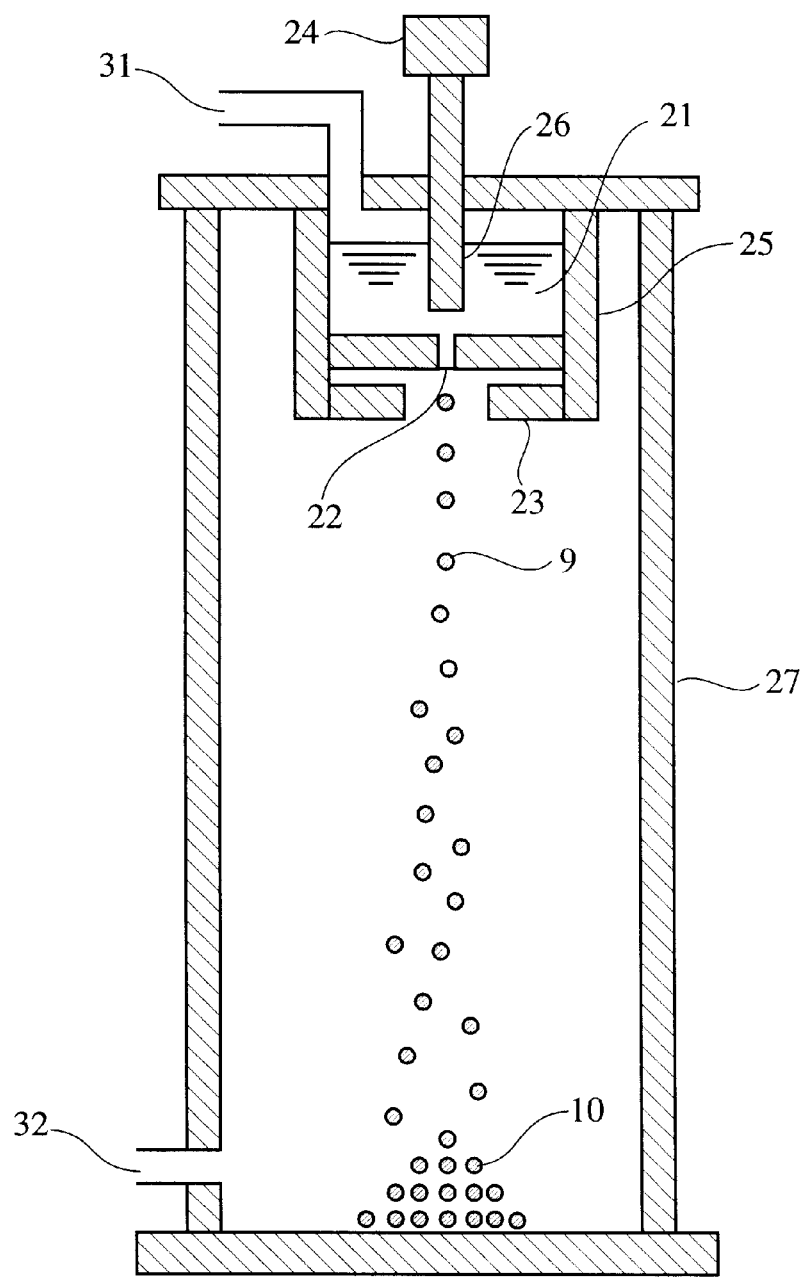
FIG. 2 is a cross-sectional view showing another example of an apparatus for producing the solder ball of the present invention.

FIG. 2 shows another example of an apparatus for producing the solder balls of the present invention. The chamber 27 is provided with a melt inlet 31 in the upper portion and an exit 32 for recovering solder balls in the bottom portion. A crucible 25 is positioned above the chamber 7 with communication with the melt inlet 31 of the chamber 7 to supply a solder alloy melt to the crucible 25 through the melt inlet 31. The crucible 25 has orifices 22 at the bottom, and a vibration rod 26 extending to the vicinity of the orifices 22 is fixed to a lower surface of a vibrator 24 constituted by a piezoelectric element, etc.

There are electrode plates 23 below the orifices 22 to apply high voltage to the melt droplets 8 ejected through the orifices 22. Because the melt droplets 9 passing through the electrode plates 23 are charged to have electric repulsion from each other, they are effectively prevented from merging. Solder balls 10 accumulated at the bottom of the chamber 27 are recovered through the exit 32 continuously or in a batch manner.

[3] Production Method

First, a solder alloy is supplied in a state of a melt or an ingot from a supply means (not shown) communicating with the crucible 3. In this case, if the melt 1 in the crucible 3 is balanced with the melt (melt droplets 9) ejected through the orifices 2, the continuous production of solder balls can be achieved. The supply of a solder melt or an ingot should be carried out without disturbing the melt 1 in the crucible 3. Regardless of whether the solder alloy is supplied in a state of a melt or an ingot, the melt 1 is heated if necessary. In the case of the continuous method, a large number of solder balls can continuously be produced as a continuous casting method by making the melt supply speed substantially equal to the melt-ejecting speed through the orifices 2.

When the vibrator 4 is vibrated, the vibration rod 6 is also vibrated via a vibration plate 14, giving predetermined vibration energy to the melt 1 in the crucible 3. As described above, because a positive differential pressure of 0.2 MPa or less, preferably 0.01–0.2 MPa is given to the crucible 3 relative to the chamber 7, the melt 1 is extruded or ejected through the orifices 2 by this differential pressure.

Because of vibration and surface tension, the extruded melt 8 has waist portions, which become thinner as the dropping melt 8 is distant from the orifices 2, so that the dropping melt 8 becomes melt droplets 9. The melt droplets 9 become spherical by a surface tension. The melt droplets 9 are solidified while falling in the chamber 7 to become solder balls. By giving a constant vibration to the melt 1, melt droplets having a uniform diameter can be obtained, resulting in solder balls 10 having a uniform diameter and high sphericity.

When the separate melt droplets 9 falling in the chamber 7 are electrically charged when passing between high voltage electrode plates 23 (FIG. 2), the merger of the melt droplets 9 can effectively be prevented by electric repulsion force given to the melt droplets 9.

In the case of a continuous system, the solder balls 10 are continuously recovered from a solder ball exit (not shown) at the bottom of the chamber 7, while in the case of a batch system as shown in FIG. 1, the resultant solder balls 10 are stored in a container 18 for accumulating solder balls. After the completion of the production, the solder ball exit is opened to recover the solder balls in the container 18.

The present invention will be described in more detail by the following EXAMPLES without intention of restricting it thereto.

EXAMPLE 1

Solder Alloy Containing Pb

Solder balls of 62Sn—Pb (mass %) having a diameter of 400 μm were produced by a uniform droplet-spraying method using an apparatus shown in FIG. 1. With a nitrogen gas in the crucible 3 pressurized at 1.2 MPa (gage pressure), a melt 1 was vibrated by using a vibrator 4 constituted by a laminate-type piezoelectric element (maximum displacement: 15 μm, number of vibration: 1.8 MHz) available from Hitachi Metals, Ltd. to eject the melt through the orifices 2. A mixed gas of a nitrogen gas and 8 volume % of a hydrogen gas was charged into the chamber 7. Liquefied nitrogen was caused to flow through a cooling pipe (not shown) spirally disposed around a path of falling melt droplets 9 to cool the inside of the chamber 7. The temperature in the chamber was about 3–5° C.

Figure 3A:
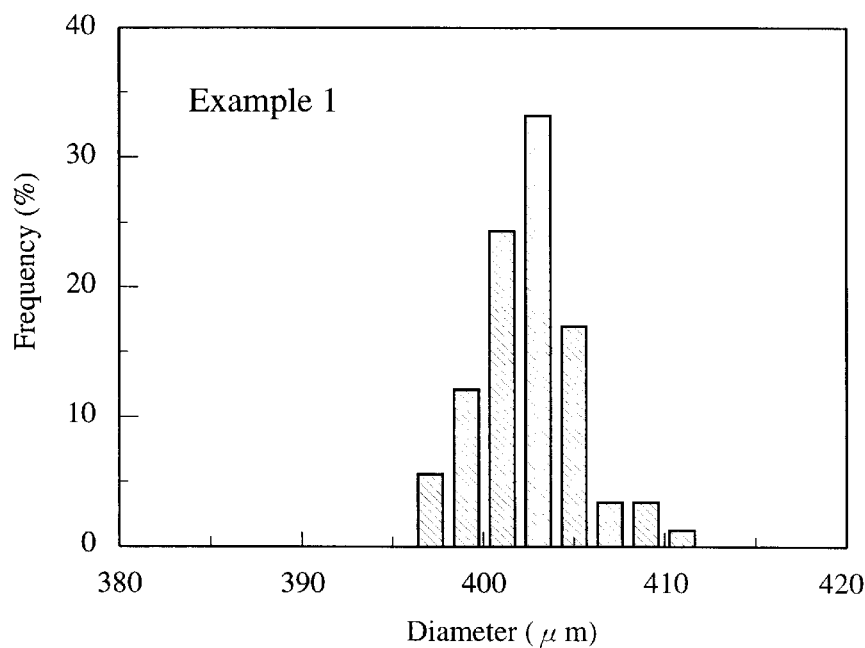
FIG. 3($a$) is a graph showing a diameter distribution of the Sn—Pb eutectic solder ball in EXAMPLE 1.
Figure 3B:
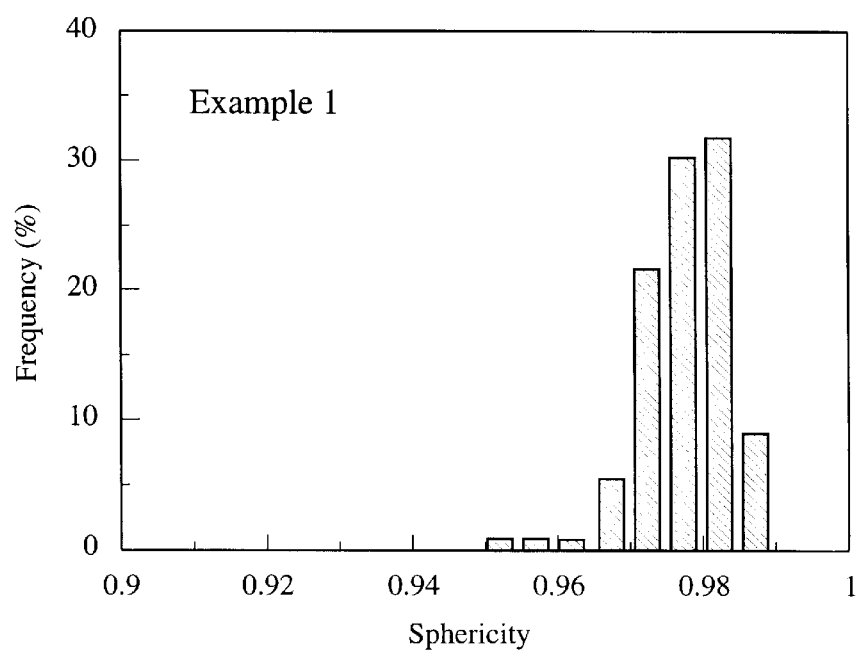

With respect to the resultant solder balls, SEM images in five fields were analyzed to determine the diameters of their corresponding circles and their maximum diameter. The diameter of a corresponding circle is a diameter of a circle that is assumed to have an area equal to the projected area of each solder ball, and the sphericity is expressed by the equation of diameter of corresponding circle/maximum diameter. FIGS. 3(a) and (b) show the diameter (diameter of corresponding circle) distribution and sphericity distribution of the solder balls obtained in this example. The diameter distribution was within 5% of the average diameter, and the sphericity was 0.98 or more. The solder balls had metallic gloss without scar, damage, deformation, etc., on the surface. The Auger electron spectroscopic analysis of the solder balls revealed that the carbon-concentrated layer had a thickness of 0.6 nm, and the oxygen-concentrated layer had a thickness of 2.4 nm on the surface.

COMPARATIVE EXAMPLE 1

A thin solder alloy wire having a diameter of 100 μm and the same composition as in EXAMPLE 1 was cut at a constant interval to provide solder pieces, which were introduced into a soybean oil heated at 195° C. in an upper portion thereof. The solder pieces were melted to become spherical, fell to a lower temperature region of the soybean oil by gravity and solidified.

Solder balls produced by this in-oil spheroidizing method were degreased by hexane. The resultant solder balls were poorer in diameter distribution, sphericity and surface metallic gloss than those of EXAMPLE 1. The Auger electron spectroscopic analysis of the solder balls revealed that on the surfaces of the solder balls, the carbon-concentrated layers were as thick as 2 nm, and the oxygen-concentrated layers were as thick as 8 nm.

COMPARATIVE EXAMPLE 2

Solder balls were produced by the same apparatus as in EXAMPLE 1 having a chamber 7, in which a can filled with a silicone oil for recovering solder balls was disposed. An upper portion of the silicone oil was heated at 235° C. After melt droplets 9 were ejected in the same manner as in EXAMPLE 1, the melt droplets 9 fell in the silicone oil to a lower temperature region and solidified. Among solder balls obtained by degreasing, there were a high percentage of large balls formed by merger of two or three solder balls. On the surfaces of the solder balls, the carbon-concentrated layers were as thick as 10.5 nm while the oxygen-concentrated layers were 0.7 nm.

COMPARATIVE EXAMPLE 3

Under the same conditions as in COMPARATIVE EXAMPLE 2 except for not heating the silicone oil, the solder balls were produced. Though the resultants solder balls included large merged balls at high percentages, their percentages were lower than those in COMPARATIVE EXAMPLE 2. Further, flat deformed solder balls were included. It is presumed that flat deformation was caused by impingement of the melt droplets 9 against the silicone oil. The solder balls had carbon-concentrated layers of 3.5 nm in thickness and oxygen-concentrated layers of 4.2 nm in thickness on their surfaces.

EXAMPLE 2, COMPARATIVE EXAMPLE 4

Solder Alloy Containing No Pb

Figure 4A:
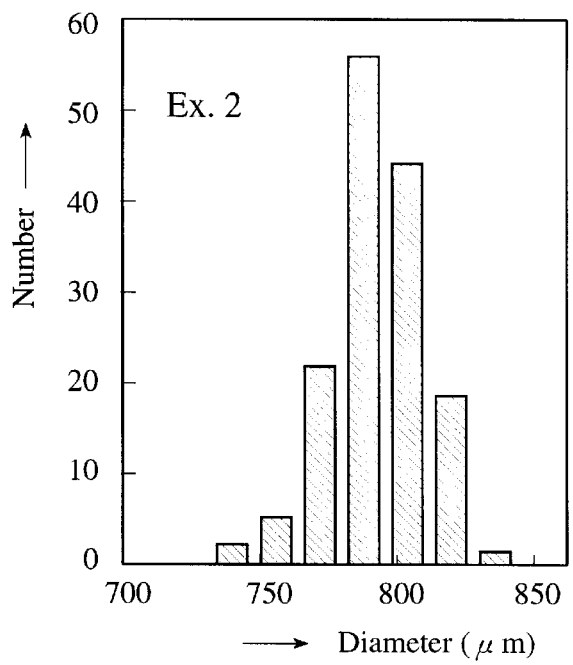
FIG. 4($a$) is a graph showing a diameter distribution of the Sn—Bi solder ball in EXAMPLE 2.
Figure 4B:
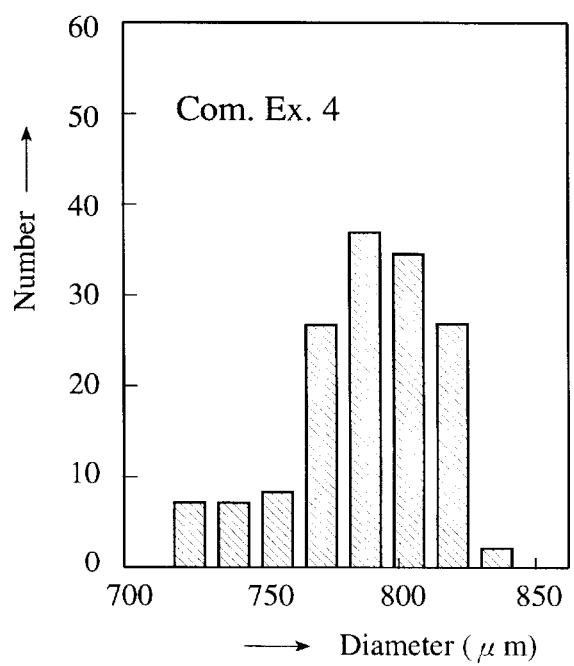

Solder balls of 58Bi-42Sn (mass %) having a diameter of 800 μm were produced by the same method (EXAMPLE 2) as in EXAMPLE 1 and by the same in-oil spheroidizing method (COMPARATIVE EXAMPLE 4) as in COMPARATIVE EXAMPLE 1. 150 solder balls were taken from each production lot of the solder balls to measure their diameters. The results are shown in FIG. 4. It is clear from FIG. 4 that the solder balls of EXAMPLE 2 had a narrower diameter distribution than that of COMPARATIVE EXAMPLE 4. The solder balls in EXAMPLE 2 had sphericity of 0.95 or more, with metallic gloss and free from surface scar, damage, deformation, etc.

Solder balls having the compositions (mass %) of Sn-3.5Ag, Sn-5Bi, Sn-5Sb, Sn-3.5Ag-0.75Cu, Sn-5Bi-1Cu, Sn-5Sb-1Cu, Sn-3.5Ag-2In, Sn-3.5Ag-1Zn, Sn-5Bi-2In, Sn-5Bi-2Ag, Sn-5Sb-2In, Sn-5Bi-2Ag, Sn-5Sb-1Zn, Sn-3.5Ag-2In-1Cu, Sn-3.5Ag-2In-1Ni, Sn-5Bi-2In-1Ag, Sn-5Bi-2In-1Cu, Sn-5Bi-2In-1Ni, Sn-5Bi-0.05Ge, Sn-5Sb-2Ag-2In, Sn-5Sb-2Ag-1Cu, and Sn-5Sb-2Ag-1Ni were produced in the same manner as in EXAMPLE 1. Any solder balls of the above compositions had narrow diameter distributions and sphericity of 0.98 or more, with metallic gloss and free from surface scar, damage, and deformation, etc.

EXAMPLE 3

The solder balls of 600 μm in diameter having various alloy compositions were produced in the same manner as in EXAMPLE 1 using the apparatus shown in FIG. 1. The chamber 7 was filled with a nitrogen gas atmosphere of 0.15 MPa (gage pressure). 92% of all the resultant solder balls had dimension accuracy within a range of 590–610 μm. As a result of measuring the sphericity (diameter of corresponding circle/maximum diameter) of 20 solder balls having dimension accuracy within a range of 590–610 μm, the sphericity was 0.98 or more.

5000 solder balls having diameters of 590–610 μm were arbitrarily selected to carry out a rolling test by which the number of solder balls stopping on a slanting plate were counted to evaluate their surface conditions as rollability. The standards of evaluation of rollability were as follows.

○: Less than 0.1% of solder balls among all the rolling solder balls stopped on the slope ( good rollability).

Δ: Less than 0.1% of solder balls stopped on the slope, though the remaining solder balls rolled in slanting directions (slight raggedness on the surface).

X: 0.1% or more of solder balls stopped (poor rollability).

20 solder balls having diameters of 590–610 μm were cut along cross sections including their centers, and the cut surfaces were mirror-polished and etched with mixed acids in methanol (2 mass % HCL+5 mass % HNO$_3$+methanol). The etched microstructure was observed by an optical microscope to image-analyze each of the resultant optical photomicrographs to determine the area ratio of the maximum dendrite in the cut surface.

Table 2 shows a composition, an area ratio of the maximum dendrite and the rollability in each solder ball. The well-rolling solder balls had excellent surface conditions. It should be noted that Samples having only colonies without dendrite are indicated as "no" in the column of the area ratio. Sample Nos. 2–15 had a Pb content of about 20 ppm.

TABLE 2

| Sample No. | Chemical Composition (mass %) | | | | | |
|---|---|---|---|---|---|---|
| | Sn | Pb | Ag | Cu | Bi | Ge |
| 1 | Bal. | 37.1 | — | — | — | — |
| 2* | Bal. | — | — | 0.4 | — | — |
| 3 | Bal. | — | — | 0.5 | — | — |
| 4 | Bal. | — | — | 2.0 | — | — |
| 5* | Bal. | — | 0.3 | — | — | — |
| 6 | Bal. | — | 1.9 | — | — | — |
| 7 | Bal. | — | 3.5 | — | — | — |
| 8 | Bal. | — | 5.5 | — | — | — |
| 9 | Bal. | — | 2.1 | 0.5 | — | — |
| 10 | Bal. | — | 3.4 | 0.7 | — | — |
| 11 | Bal. | — | 4.5 | 0.3 | — | — |
| 12 | Bal. | — | 2.0 | — | 3.0 | — |
| 13 | Bal. | — | 3.1 | 0.5 | 2.1 | — |
| 14 | Bal. | — | 5.9 | 1.9 | 10.0 | — |
| 15 | Bal. | — | 3.6 | — | — | 0.001 |

| Sample No. | Area Ratio (%) | Rollability |
|---|---|---|
| 1 | No | ○ |
| 2 | 82 | X |
| 3 | 79 | Δ |
| 4 | 59 | ○ |
| 5* | 84 | X |
| 6 | 66 | Δ |
| 7 | 55 | ○ |
| 8 | No | ○ |
| 9 | 49 | ○ |
| 10 | 29 | ○ |
| 11 | No | ○ |
| 12 | 31 | ○ |
| 13 | 28 | ○ |
| 14 | 20 | ○ |
| 15 | 51 | ○ |

Note* COMPARATIVE EXAMPLE.

As is clear from Table 2, Sample No. 1 was an Sn—Pb solder ball most generally used at present. The solidification structure of this solder ball consisted only of colonies, providing good rollability and smooth surface.

Sample No. 2 was an Sn solder ball containing 0.4 mass % of Cu. It area ratio of the maximum dendrite of 82%, with extremely ragged and extremely poor rollability. Sample No. 3 was an Sn solder ball containing 0.5 mass % of Cu, having an area ratio of the maximum dendrite of 79% with improved surface conditions and rollability than those of Sample No. 2. Sample No. 4 was an Sn solder ball containing 2.0 mass % of Cu having an area ratio of the maximum dendrite of 59% with extremely smooth surface.

The comparison of Sn—Cu alloys of Sample Nos. 2–4 revealed that as the Cu content increased from 0.4 mass % to 0.5 and 2.0 mass %, the area ratio of the maximum dendrite decreased, providing smoother surface. Particularly, Sample No. 3 containing 0.5 mass % or more of Cu had better surface smoothness than Sample No. 2 containing less than 0.5 mass % of Cu.

Sample No. 5 was an Sn solder ball containing 0.3 mass % of Ag having an area ratio of the maximum dendrite of 84% with a ragged surface. Sample No. 6 was an Sn solder ball containing 1.9 mass % of Ag having an area ratio of the maximum dendrite of 66% with a better surface smoothness than Sample No. 5. Sample No. 7 was an Sn solder ball containing 3.5 mass % of Ag having an area ratio of the maximum dendrite of 55% with a good surface smoothness.

Sample No. 8 was an Sn solder ball containing 5.5 mass % of Ag consisting only of colonies with extremely smooth surface.

The comparison of Sn—Ag alloys of Samples Nos. 5–8 revealed that as the Ag content increased from 0.3 mass % to 1.9, 3.5 and 5.5 mass %, the area ratio of the maximum dendrite decreased, providing smoother surface.

Sample Nos. 9–15 were solder balls having compositions containing 2.0 mass % or more, in total, of Ag, Cu, Bi and Ge to Sn. Each Sample had an area ratio of the maximum dendrite of less than 60% with smooth surface.

Figure 6:
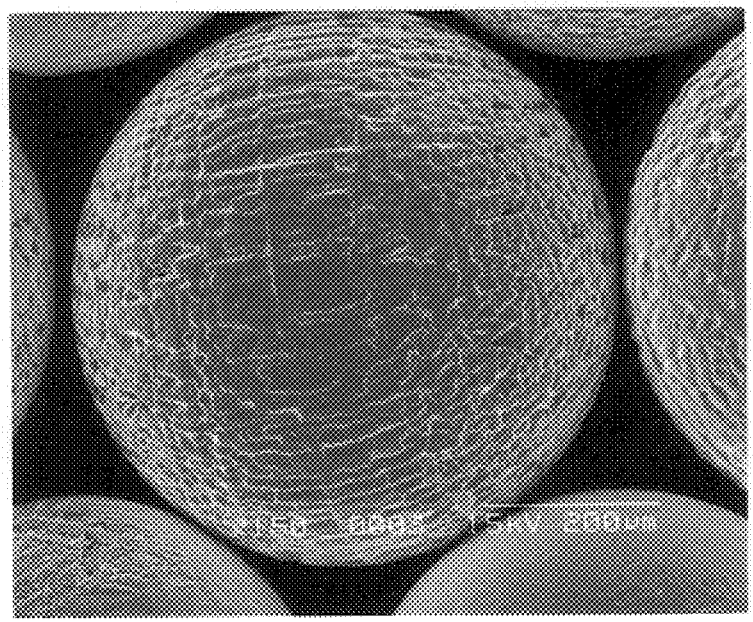
FIG. 6 is a scanning-type electron photomicrograph showing a surface condition of the solder ball having surface raggedness of Sample No. 5 (COMPARATIVE EXAMPLE)
Figure 7:
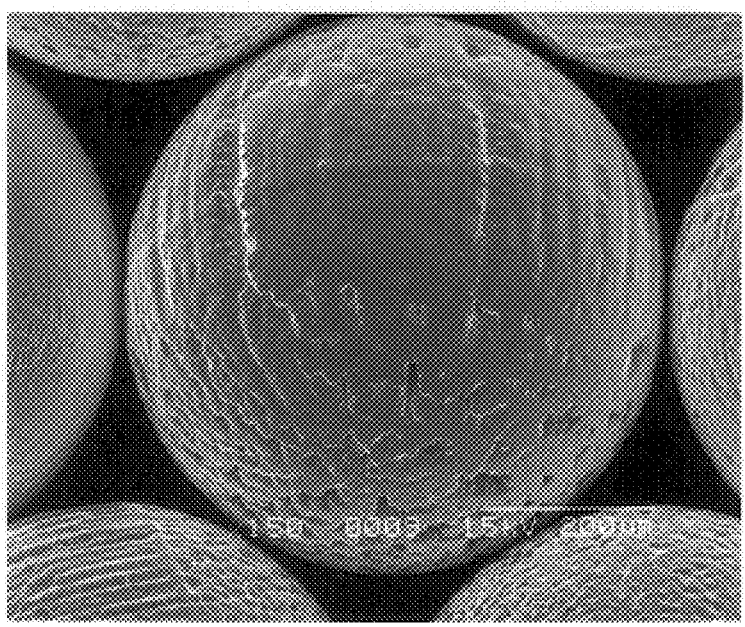
FIG. 7 is a scanning-type electron photomicrograph showing a surface condition of the solder ball having surface raggedness of Sample No. 5 (COMPARATIVE EXAMPLE)

FIGS. 6 and 7 are scanning-type electron photomicrographs of solder balls of Sample No. 5. FIG. 6 shows a ragged surface pattern generated by tip ends of dendrite projecting from the surface of the solder ball. This was presumably generated in the final phase of solidification. On the other hand, FIG. 7 shows a surface having a relatively wide smooth area. It is presumed that the solidification of the solder ball started from this surface area. Thus, solder ball of Sample No. 5 had a surface mostly ragged by the projection of the dendrite tip as shown in FIG. 6, though some of the surface was smooth as shown in FIG. 7.

Figure 8:
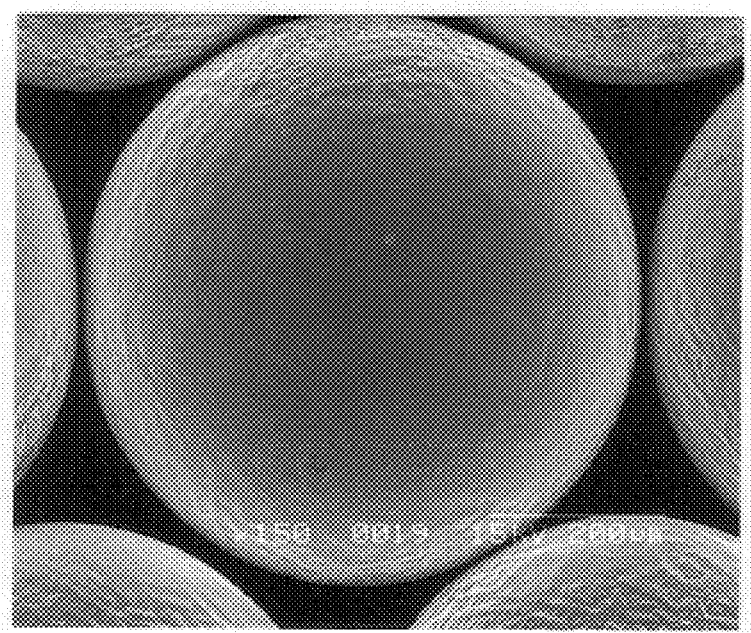
FIG. 8 is a scanning-type electron photomicrograph showing a surface condition of the solder ball of Sample No. 7 (EXAMPLE)
Figure 9:
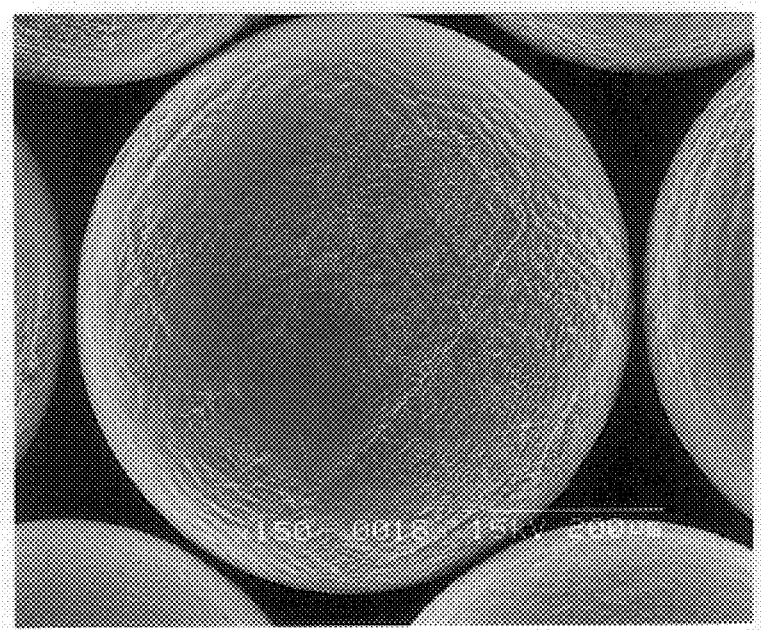
FIG. 9 is a scanning-type electron photomicrograph showing a surface condition of the solder ball of Sample No. 7 (EXAMPLE)

FIGS. 8 and 9 are scanning-type electron photomicrographs of solder balls of Sample No. 7. FIG. 9 shows that the solder ball consisted of two crystals. As is clear from FIGS. 8 and 9, the solder balls of Sample No. 7 had better surface smoothness than those of Sample No. 5 shown in FIGS. 6 and 7.

EXAMPLE 4

Solder balls of 600 μm in diameter having various alloy compositions were produced under the same conditions as in EXAMPLE 3 using the apparatus shown in FIG. 2, and 300 solder balls thus produced were observed with respect to surface conditions by a scanning-type electro microscope. The surface smoothness of solder balls was evaluated from the scanning-type electron photomicrographs by the following standards.

○: Less than 6% of all the solder balls have ragged surface as shown in FIG. 11, and the remaining solder balls have smooth surface as shown in FIG. 10 (solder balls have excellent surface smoothness).

X: 6% or more of all the solder balls have ragged surface as shown in FIG. 11, and the remaining solder balls have smooth surface as shown in FIG. 10 (solder balls have poor surface smoothness).

5000 solder balls produced under the same conditions as above were evaluated with respect to rollability under the same conditions as in EXAMPLE 3. It should be noted that the evaluation standards of this surface smoothness are stricter than those of rollability in EXAMPLE 3, with the surface smoothness of "○" corresponding to less than 0.05% of solder balls stopping on the slope, and the surface smoothness of "X" corresponding to less than 0.1% of solder balls stopping on the slope. As a result of diameter measurement of 300 balls, it was found that the diameter accuracy was within a range of 600 μm±7 μm and the sphericity (diameter of a corresponding circle/maximum diameter) was about 0.98 or more.

Table 3 shows the alloy composition, rollability and surface smoothness of a solder ball of each Sample. It should be noted that Samples having only colonies without dendrite are indicated as "no" in the column of the area ratio. The column of the second additional elements indicates the content of an element existing in the maximum amount (mass %).

TABLE 3

| Sample No. | Chemical Composition (mass %) | | | | |
|---|---|---|---|---|---|
| | Sn | Ag | Cu | Total Amount of Second Additional Element | Element in Maximum Content (amount) |
| 16 | Bal. | 1.0 | — | 0.020 | Mn: 0.018 |
| 17 | Bal. | 3.5 | — | 0.010 | Ge: 0.007 |
| 18 | Bal. | 4.4 | — | 0.198 | Bi: 0.190 |
| 19 | Bal. | 1.1 | — | 0.009 | Mn: 0.003 |
| 20 | Bal. | 3.5 | — | 0.009 | Ge: 0.006 |
| 21 | Bal. | 4.5 | — | 0.008 | Bi: 0.001 |
| 22 | Bal. | — | 0.3 | 0.105 | Ni: 0.100 |
| 23 | Bal. | — | 0.7 | 0.136 | Sb: 0.130 |
| 24 | Bal. | — | 1.2 | 0.177 | P: 0.172 |
| 25 | Bal. | — | 0.3 | 0.008 | Ni: 0.002 |
| 26 | Bal. | — | 0.8 | 0.007 | Sb: 0.001 |
| 27 | Bal. | — | 1.2 | 0.007 | P: 0.002 |
| 28 | Bal. | 1.1 | 0.3 | 0.006 | Au: 0.004 |
| 29 | Bal. | 2.1 | 1.2 | 0.080 | Pd: 0.075 |
| 30 | Bal. | 3.0 | 0.5 | 0.012 | Ge: 0.006 |
| 31 | Bal. | 3.5 | 0.7 | 0.054 | In: 0.050 |
| 32 | Bal. | 4.5 | 0.3 | 0.013 | Ge: 0.005<br>In: 0.005 |
| 33 | Bal. | 1.0 | 0.3 | 0.005 | Au: 0.001 |
| 34 | Bal. | 2.1 | 1.2 | 0.005 | Pd: 0.001 |
| 35 | Bal. | 3.1 | 0.5 | 0.005 | Ge: 0.004 |
| 36 | Bal. | 3.5 | 0.7 | 0.004 | In: 0.002 |
| 37 | Bal. | 4.5 | 0.4 | 0.003 | Ge: 0.001<br>In: 0.001 |

| Sample No. | Rollability | Surface Smoothness |
|---|---|---|
| 16 | ○ | ○ |
| 17 | ○ | ○ |
| 18 | ○ | ○ |
| 19 | ○ | X |
| 20 | ○ | X |
| 21 | ○ | X |
| 22 | ○ | ○ |
| 23 | ○ | ○ |
| 24 | ○ | ○ |
| 25 | ○ | X |
| 26 | ○ | X |
| 27 | ○ | X |
| 28 | ○ | ○ |
| 29 | ○ | ○ |
| 30 | ○ | ○ |
| 31 | ○ | ○ |
| 32 | ○ | ○ |
| 33 | ○ | X |
| 34 | ○ | X |
| 35 | ○ | X |
| 36 | ○ | X |
| 37 | ○ | X |

Sample Nos. 16–21 were solder balls made of alloys of Sn—Ag containing two or more of Mn, Ge and Bi. Sample Nos. 16–18 containing 0.01 mass % or more, in total, of the second additional elements had smooth surface. On the other hand, the solder balls of Sample Nos. 19–21 containing less than 0.01 mass %, in total, of the second additional elements had ragged surface. These results indicate that to provide solder balls based on Sn—Ag with smooth surface, the total amount of the second additional elements should be 0.01 mass % or more.

Sample Nos. 22–27 were solder balls made of Sn—Cu alloys containing two or more of Ni, Sb and P. Solder balls of Sample Nos. 22–24 containing 0.01 mass % or more, in total, of the second additional elements had smooth surface. On the other hand, the solder balls of Sample Nos. 25–27 containing less than 0.01 mass %, in total, of the second additional elements had ragged surface. These results indicate that to provide solder balls based on Sn—Cu with smooth surface, the total amount of second additional elements should be 0.01 mass % or more.

Sample Nos. 28–37 were solder balls made of alloys of Sn—Ag—Cu containing tow or more of Au, Pd, Ge and In. Sample Nos. 28–32 containing 0.006 mass % or more, in total, of the second additional elements had smooth surface. On the other hand, Sample Nos. 33–37 containing less than 0.006 mass %, in total, of the second additional elements had ragged surface.

These results indicate that to provide solder balls based on Sn—Ag—Cu with smooth surface, the total amount of the second additional elements should be 0.006 mass % or more.

As described above, the solder balls of the present invention have high sphericity, high dimension accuracy and a narrow dimension distribution with smooth and clean surface. Accordingly, they can easily be used for BGA packaging, etc., contributing to improvement in productivity and decrease in the percentage of the defectiveness.

What is claimed is:

1. A solder ball, wherein an area ratio of the maximum dendrite is 80% or less of a cross section including a center of said solder ball, said solder ball containing 0.5–60 mass %, in total, of one or more additional elements for lowering the melting point of Sn, the balance being substantially Sn, wherein said solder ball is made of a solder alloy containing no Pb.

2. The solder ball according to claim 1, wherein said solder ball is made of any one of an Sn—Ag alloy, an Sn—Cu alloy, an Sn—Bi alloy, an Sn—Zn alloy, an Sn—Ag—Cu alloy, an Sn—Ag—Bi alloy, an Sn—Zn—Bi alloy, a Bi—Sn—Ag alloy and an Sn—Ag—Cu—Bi alloy.

3. The solder ball according to claim 1, wherein said solder ball comprises Ag and/or Cu, the balance being substantially Sn.

4. The solder ball according to claim 3, wherein said solder ball comprises 0.5–8 mass % of Ag.

5. The solder ball according to claim 3, wherein said solder ball comprises 0.5–3 mass % of Cu.

6. The solder ball according to claim 3, further containing 0.001–10 mass % of Bi.

7. The solder ball according to claim 1, wherein said solder ball comprises a first additional element comprising 0.5–8 mass % of Ag or 0.1–3 mass % of Cu, and 0.01–0.5 mass %, in total, of at least one second additional element selected from the group consisting of Bi, Ge, Ni, P, Mn, Au, Pd, Pt, S, In and Sb, the balance being substantially Sn.

8. The solder ball according to claim 1, wherein said solder ball comprises a first additional element comprising 0.5–8 mass % of Ag and 0.1–3 mass % of Cu, and 0.006–0.5 mass %, in total, of at least one second additional element selected from the group consisting of Bi, Ge, Ni, P, Mn, Au, Pd, Pt, S, In and Sb, the balance being substantially Sn.

9. The solder ball according to claim 7, wherein said solder ball comprises 1–4.5 mass % of Ag, and 0.01–0.2 mass % of said second additional element, the balance being substantially Sn.

10. The solder ball according to claim 7, wherein said solder ball comprises 0.3–1.2 mass % of Cu, and 0.01–0.2 mass % of said second additional element, the balance being substantially Sn.

11. The solder ball according to claim 8, wherein said solder ball comprises 1–4.5 mass % of Ag, 0.3–1.2 mass % of Cu, and 0.006–0.1 mass % of said second additional element, the balance being substantially Sn.

12. The solder ball according to claim 9, further comprising 0.1 mass % or less of Ge.

13. The solder ball according to claim 10, further comprising 0.1 mass % or less of Ge.

14. The solder ball according to claim 11, further comprising 0.1 mass % or less of Ge.

15. A method for producing solder balls consisting essentially of the steps of vibrating a melt of a solder alloy in a crucible under pressure to force said melt to drop through orifices of said crucible; permitting said melt dropping through said orifices to become spherical droplets in a chamber filled with a non-oxidizing gas atmosphere; and rapidly solidifying the spherical droplets.

16. The method for producing solder balls according to claim 15, wherein said non-oxidizing atmosphere is a reducing atmosphere.

17. The method for producing a solder ball according to claim 16, wherein said reducing atmosphere is an inert gas atmosphere containing 5–10 volume % of hydrogen.

18. The method for producing solder balls according to claim 15, wherein 60% or more of said solder balls have diameters of 1.2 mm or less, their diameter distribution being ±5% or less of an average diameter, with sphericity of 0.95 or more.

* * * * *